United States Patent [19]

Boling

[11] Patent Number: 5,714,009

[45] Date of Patent: Feb. 3, 1998

[54] APPARATUS FOR GENERATING LARGE DISTRIBUTED PLASMAS BY MEANS OF PLASMA-GUIDED MICROWAVE POWER

[75] Inventor: Norman L. Boling, Santa Rosa, Calif.

[73] Assignee: Deposition Sciences, Inc., Santa Rosa, Calif.

[21] Appl. No.: 371,195

[22] Filed: Jan. 11, 1995

[51] Int. Cl.$^6$ .................................................. C23C 16/00
[52] U.S. Cl. ............................ 118/723 MW; 118/723 ME
[58] Field of Search ............................ 118/723 MW, 118/723 MP, 723 MA, 723 MR, 723 ME; 150/345; 204/298.38

[56] References Cited

U.S. PATENT DOCUMENTS

| | | | |
|---|---|---|---|
| 4,952,273 | 8/1990 | Popov | 156/643 |
| 4,987,284 | 1/1991 | Fujimura | 204/298.38 |
| 5,359,177 | 10/1994 | Taki | 219/121.43 |
| 5,364,519 | 11/1994 | Fujimura et al. | 204/298.38 |

FOREIGN PATENT DOCUMENTS 5-136091  6/1993  Japan ................... 204/298.38

*Primary Examiner*—John Niebling
*Assistant Examiner*—Joni Y. Chang
*Attorney, Agent, or Firm*—Malcolm B. Wittenberg

[57] ABSTRACT

An apparatus and method for generating a plasma within a volume containing a mixture of gaseous species. To generate the plasma, at least one large area applicator, which is a part of this invention, is employed. At least one microwave generator introduces microwave power into the applicator by means of suitable waveguides and couplers.

38 Claims, 8 Drawing Sheets

5,714,009

APPARATUS FOR GENERATING LARGE DISTRIBUTED PLASMAS BY MEANS OF PLASMA-GUIDED MICROWAVE POWER

TECHNICAL FIELD OF THE INVENTION

This invention relates to the generation of a controlled plasma, consisting of partially ionized gas contained in a reaction vessel, in order to carry out some industrial process. By a controlled plasma, it is meant that the apparatus which is employed to generate such a plasma is able to achieve a desired spatial distribution of plasma properties so the plasma is optimally effective in a given application.

BACKGROUND OF THE INVENTION

Controlled plasmas are used in the manufacture of optical interference coatings by sputtering either in a batch process, such as one which employs a drum as a substrate holder, or a continuous process, where substrates are carried on a belt or web. Coatings manufactured by batch or continuous sputtering processes find many applications in addition to the optical interference coatings just mentioned. These include but are not limited to coatings which (1) create a desired electrical resistance on the surface of the substrate being coated, (2) are protective in nature, or (3) influence the qualities of a surface in order to enhance some desired feature such as durability or cleanability. In addition to being useful in the production of coatings, plasmas produced using this invention can be used for other purposes, including but not limited to inducing chemical reactions in the synthesis of a desired material, and treatment of textiles or plastics to improve their properties.

A plasma is a body of partially ionized gas containing ions, excited atoms or molecules and electrons. Plasmas are useful in many types of industrial processes. They can be generated by exciting a gas at low pressure with electromagnetic power which may range in frequency from DC to a microwave frequency such as 2.45 Ghz or even to optical frequencies. The advantages of radio frequency or microwave excitation are well known. They include elimination of electrodes, which can cause contamination, and more effective coupling of power into the plasma. However, the ability to use RF or microwave-excited plasmas effectively has been limited by the difficulty of coupling the power into a large volume of plasma with a low-cost, stable, and maintainable device.

The earliest attempts to excite a plasma with microwave power made use of well known devices such as antennas, horns, or resonators. These early attempts had the disadvantage that the area over which the plasma was generated was too small to be useful in many applications. Later Weissfloch et al (U.S. Pat. No. 3,814,983 dated Jun. 4, 1974) described a device and method for plasma generation inside a long quartz tube. Their invention used an electromagnetic field propagating in a periodic "slow wave" structure to excite the plasma. The slow wave structure was an elongated assembly of rods that were spaced along conducting bars. Electromagnetic waves traveling along this structure generated an intense electric field that entered an adjacent dielectric tube containing the material to be ionized. The electric field caused a discharge in the material, thereby creating the plasma. The RF components essential to their invention, including the slow wave structure, were part of the prior art at the time that U.S. Pat. No. 3,814,983 was issued.

The Weissfloch invention had the disadvantage that the plasma generated by it was confined to a tube of 19 mm diameter in which it could not readily be used for many industrial batch or continuous processes. Furthermore, generation of a uniform plasma proved to be difficult. Since the excitation was provided by a wave traveling in the slow wave structure, the wave was attenuated by the loss of energy to the plasma in the tube as it traveled along the structure. To achieve a roughly uniform plasma along the length of the tube it was necessary to arrange the axes of the slow wave structure and the tube so that they intersected to form a small (highly acute) angle, thus bringing them into closer proximity as the exciting field decreased. The required acute angle varied with operating conditions, making it difficult to achieve desired plasma uniformity with this invention.

Inventions described in several subsequent patents also relied on the slow wave technique taught by Weissfloch. Kieser (U.S. Pat. No. 4,521,717 dated Jun. 4, 1985) taught the use of a dual slow wave structure to enhance uniformity of plasma in an application involving coating of substrates by plasma polymerization of monomers. The axes of the two parts of the dual structure were arranged so that they formed equal acute angles with the axis of the plasma region as taught by Weissfloch in U.S. Pat. No. 3,814,983. Therefore, coupling of power into the plasma from either structure was subject to the same difficulties with uniformity as in Weissfloch, but the effect was partially compensated by the use of the two symmetrically disposed excitation mechanisms. An improvement in uniformity was achieved at the expense of doubling the amount of RF hardware required.

In U.S. Pat. No. 4,630,568 dated Dec. 23, 1986 Kieser disclosed an apparatus for coating substrates by plasma polymerization. This apparatus represented a refinement of that disclosed in 4,521,717, having features which enhanced the ease of maintenance and operation.

In a subsequent U.S. Pat. No. (4,847,460 dated Jul. 11, 1989) Kieser et al noted the complexity and relatively high cost of the device disclosed in U.S. Pat. No. 4,630,568 as well as its inability to produce sufficient plasma uniformity and volume to meet the requirements of many applications. To overcome these deficiencies, they taught the use of a system employing a single slow wave structure to generate the required electric field in the plasma. Uniformity of the field along the slow wave structure was achieved in part by the use of a plurality of microwave generators which feed the structure. The generators were operated in a phase locked mode; that is, there was a fixed phase difference between the signals provided by all transmitters. Also, the power output of each generator was taught to be kept as nearly constant as possible. While U.S. Pat. No. 4,847,460 claimed to produce an improvement in uniformity of deposition beyond that achievable with prior art, the required microwave generation and distribution system and components were costly and complex.

Thus, the most recent advances in distributed plasma generation have resulted in the development of devices such as slow wave structures driven by matched microwave sources. These devices suffer from the disadvantage that, in order to overcome problems such as instability and non-uniformity of excitation in the plasma, equipment of considerable complexity and cost is required.

Furthermore, the physical nature of prior-art applicators which rely on periodic slow wave structures prevents the convenient mounting of permanent magnets in a physical position which enables the magnetic field generated by these magnets to enter the plasma over a large area. It is well known that such a magnetic field may be used in a variety of ways to enhance generation, confinement, and shaping of the plasma generated by the applicator.

Furthermore, many applications of microwave plasmas involve treatment of substrates which are damaged when exposed to microwave radiation. Examples are electronic or electrical devices which may be destroyed by microwave power coupled into them during processing. Many applicators taught in the prior art allow microwave power to penetrate deeply into or even through the plasma, where it can damage such devices. As will become clear, the present invention does not allow microwaves to travel deeply into the adjacent plasma vessel, since power not absorbed by the plasma is reflected back into the interior of the applicator.

It is therefore an object of this invention to provide a means of excitation of a large volume plasma by microwave energy using relatively simple components which are relatively low-cost when compared to prior art structures.

It is a further objective of this invention to provide an applicator whose physical dimensions allow a configuration of permanent magnets to be mounted in a position immediately adjacent to the plasma. When the magnets are so located, the magnetic field which they generate can enter the plasma region, producing desired enhancement of plasma generation as well as confinement or direction of the generated plasma.

It is a further objective of this invention to provide a plasma applicator in which a reflecting boundary within the applicator prevents the propagation of microwaves into the region of the plasma chamber which contains the devices to be treated, thereby preventing exposure of these devices to the possibly damaging effects of the microwaves.

It is a still further objective of this invention to provide a microwave applicator which provides a means for introducing a reactive material directly into the region of plasma generation, thereby achieving a higher rate of conversion of the material to an active state than has been available in the prior art.

SUMMARY OF THE INVENTION

The invention is a method and apparatus for generating a controlled plasma within a large volume of gas, usually at low pressure, contained within a reaction vessel. The apparatus consists of at least one unique microwave-activated plasma applicator which generates a plasma in a region of the gas which is adjacent to it. Operation of the invention is dependent on the principle that the plasma as it is being formed reflects a portion of the microwave power that would otherwise travel into the chamber back into the applicator where it is directed into the remaining portion of the applicator so as to extend the zone of plasma generation along the entire region on the surface of the applicator in which microwaves contact the gas. This results in a spatial distribution of plasma density that is relatively uniform compared to other devices known to the art and also prevents the microwave power from entering the chamber where it could damage certain types of devices.

In operation the applicator is coupled to microwave equipment which is well known in the art. The equipment includes a microwave generator, a means for coupling microwave energy into the applicator from the microwave generator, a matching device or "tuner" for maximizing transfer of power between the microwave generator and the plasma applicator, and measuring devices for monitoring the flow of microwave power between the components or within the reaction chamber.

Embodiments of the invention may include a terminating devise to absorb, reflect or change the phase of microwave power at a port located on the applicator. Other embodiments comprise the use of a plurality of actuators in a physical configuration that achieves a desired level of plasma density, spatial uniformity over a suitably large volume.

The invention also includes the use of at least one applicator of the type described above in a process such as sputtering, chemical vapor deposition or plasma etching in which a plasma is required.

DETAILED DESCRIPTION OF THE INVENTION

Figure 1:
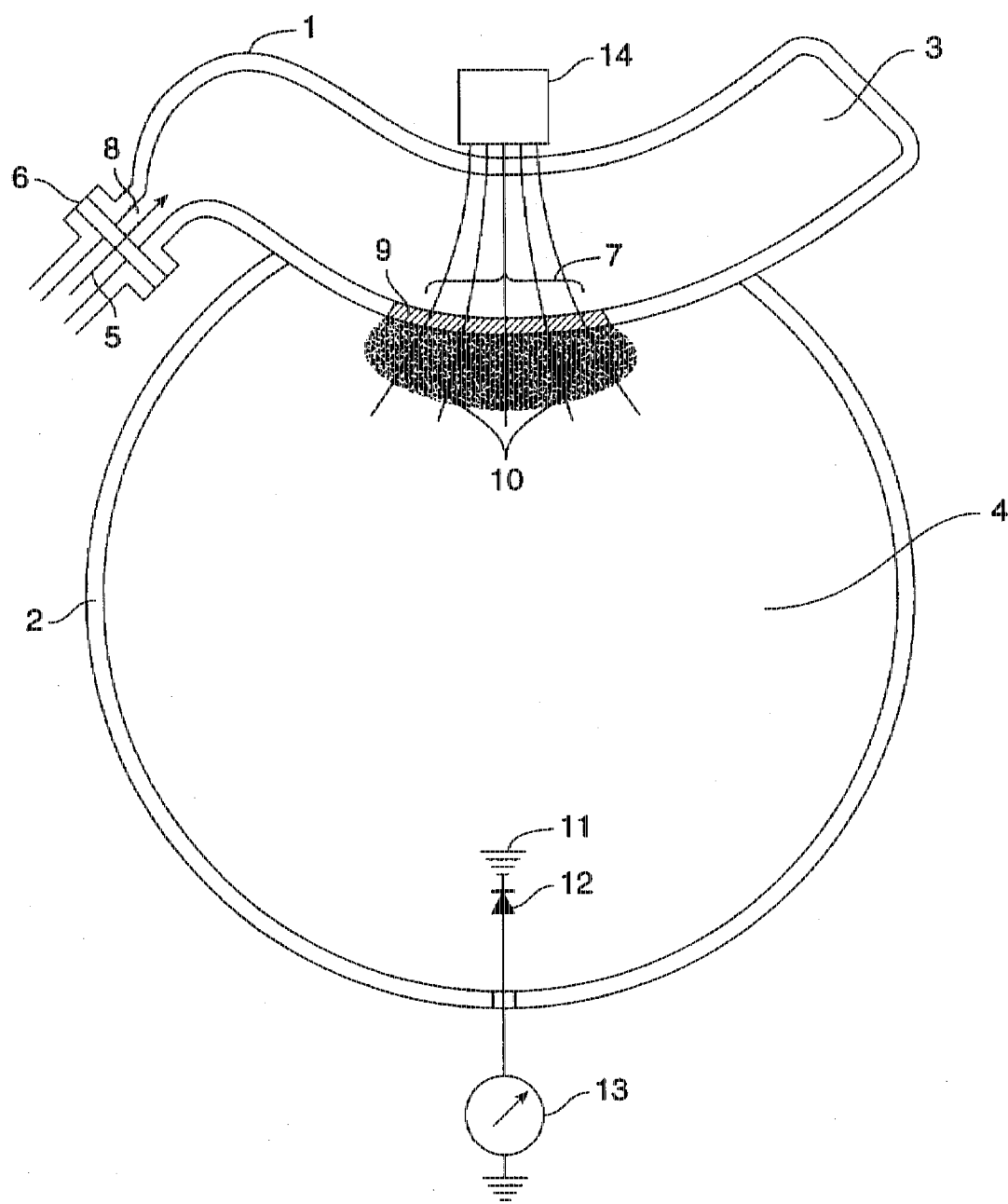
FIG. 1 illustrates in section a plasma applicator of the present invention.

The plasma applicator comprises a hollow conductor connected to a microwave power supply and immersed in or adjacent to the volume in which the plasma is to be generated. The interior of the hollow conductor may contain a vacuum, a gas at high enough pressure to preclude breakdown, a microwave-transparent liquid or a solid dielectric. A portion of the closed metal wall of the conductor is removed. If the material inside the hollow conductor is not a solid dielectric, a piece of dielectric material which is penetrable by microwaves is attached in such a way as to cover the void created by the removal of the conducting wall. This piece of dielectric may take any form but generally has the form of a plate. It has two functions. First, if the material within the conductor is a gas or a liquid, it prevents the material inside the conductor from entering the plasma volume. Second, it allows microwaves that have been introduced into the hollow within the conductor from the microwave generator to enter the space in which the plasma is to be created. The microwaves then ignite the plasma in a region immediately adjacent to the outer surface of the dielectric. This plasma at the outer wall of the dielectric forms a partially reflecting boundary which functions in a manner that is similar to that of the conducting wall which it has replaced. That is, it reflects the portion of the power that has not been absorbed by the plasma back into the interior of the hollow conductor. Thus, in spite of loss of microwave energy to the plasma, propagation of electromagnetic energy or electromagnetic resonance in the volume within the conductor can be achieved. In a properly designed configuration, the propagation or resonance within the conductor will bring about a distribution of plasma on the outer surface which has the properties required for a given application.

The hollow conductor may take any physical form. In a particular embodiment it will take a form that is the most appropriate for that embodiment. A form which is well known to the art is that of a waveguide, which is a hollow conductor resembling a pipe that is designed to convey microwave power between ports at its extreme ends. Another form is that of a resonator, which may have only one port and supports the generation of electromagnetic standing waves within it.

In an embodiment of the present invention, which is discussed later in detail, an applicator consisting of a long rectangular waveguide in which one of the four walls has been removed and a quartz slab has been attached in its place is employed. To excite the plasma an RF supply suitably equipped with a tuner, recirculator and detectors for monitoring reflected and transmitted power is coupled to the input port of the applicator by means of a system of microwave plumbing. At the output port of the applicator, some other microwave device, such as a microwave short, partial reflector or dummy load is connected.

To operate the applicator, the microwave power provided by the supply is increased to a level at which the field at the end of the quartz plate which is nearest to the microwave supply is sufficient to ignite the plasma. A layer of ignited plasma then travels along the boundary between the plasma and dielectric, causing a conducting region to form along the entire length of the quartz plate. This conducting region reflects a portion of the microwave power impinging on the boundary so that the flow of power is guided through the apparatus toward the device (e.g. reflector) at the opposite end.

During the time that a plasma is sustained at the boundary by the microwave field, diffusion of electrons and ions away from the boundary occurs, resulting in a distribution of the plasma over the volume adjacent to the device. The power per unit length of the waveguide which is delivered to the plasma is distributed along the guide in a manner which depends on the termination of the guide and can be adjusted to meet the requirements of a particular application. Thus this embodiment provides a simple and inexpensive method for generating a controlled plasma in an elongated region of space where it may be applied to many industrial processes.

If the material within the hollow conductor is a solid dielectric, the dielectric material itself forms the interface with the plasma so that no additional dielectric window is required. The presence of the dielectric effectively reduces the microwave wavelength by a factor equal to the square root of the dielectric constant of the material, so that the dimensions of the hollow conductor are reduced by the same factor compared to those required when the conductor is filled with air or a vacuum. This same reduction in size is applied to the distance between locations of intense plasma generation along the axis of the guide since they correspond to the locations of the nodes of the standing waves within the guide. More compact spacing of the locations of plasma generation leads to an improvement in the uniformity of the plasma at the substrate surface, since such variations tend to be smoothed out when the distance between peaks becomes less than the distance between the applicator and the substrate.

The reduction in size which is made possible by using a dielectric-filled applicator may allow lower microwave frequencies to be used to power applicators where physical compactness is required. For example, an aluminum oxide dielectric-filled applicator operating at 915 MHz would scale to about the same size as an applicator operating at 2.45 GHz so that it could in some circumstances physically and functionally replace such an applicator. This could be advantageous in some applications, since microwave generators that are capable of generating a given level of power at 915 MHz are less costly than those capable of generating that level of power at the higher frequency.

Use of a solid dielectric that fills the inside of the conductor has the further benefit that it eliminates the dielectric "window" that separates the interior of the hollow conductor from the plasma. This has the effect of simplifying the mechanical design of the applicator and the vacuum seal required between the plasma chamber and the applicator. It also reduces the overall thickness of the applicator.

In an embodiment in which the hollow conductor takes the physical form of a rectangular waveguide, the dimension of the applicator that is measured perpendicular to the plasma dielectric interface may be reduced to a value that is limited only by the electrical breakdown strength of the material in the applicator and the microwave power that is to be applied to the applicator. Such an applicator is then operated in a mode known to the art as the $TE_{1,0}$ mode. By filling the applicator with a dielectric such as $SiO_2$ or $Al_2O_3$ having a high electrical breakdown strength, this perpendicular dimension can be reduced by an order of magnitude over that of an air-filled guide. The overall dimension of the applicator is reduced, through the use of the dielectric, not only by this factor, but also by the thickness of the window which is eliminated in these embodiments.

The reduction of the above dimension makes it possible to mount a configuration of permanent magnets in a physical location from which they can cause a strong magnetic field to be distributed over a large volume of the plasma adjacent to the plasma/applicator boundary on the opposite side of the applicator on which they are mounted.

For applications involving reactive sputtering, the applicator which is a part of this invention may have attached or adjacent to it at least one manifold, which is an elongated hollow chamber connected to a supply of reactive gas. Gas from the supply enters the manifold which conveys it to the region of plasma generation. The gas exits the manifold by means of at least one orifice located in the region of the dielectric boundary between the plasma and the dielectric of the applicator. The gas is then activated by the applicator and diffuses to the region of the substrate where it reacts with the material that has been deposited on the substrate. Use of the applicator with attached or adjacent manifold results in the generation of a greater concentration of activated reactive species at the substrate surface, providing a higher rate of coating formation than has been available in the past.

The principle which underlies the operation of the generator is illustrated in FIG. 1. A hollow conductor 1, containing a vacuum, a gas which is normally air, or a solid or liquid dielectric 3 is immersed within or contiguous to a medium 4 in which a plasma is to be ignited. The medium is contained in a plasma vessel 2. At least one aperture 8 in the hollow conductor is provided to allow conveyance of microwave power to the interior of the hollow conductor from at least one microwave-conveying device (not shown). If the space inside the hollow conductor is filled by a vacuum or by a fluid, a mechanical barrier 6 which is penetrable by microwaves must be provided to block the flow of fluid across the aperture and thereby prevent it from entering the conveying device.

Some portion of the hollow conductor which would otherwise be contiguous to the medium 4 is removed and, if the material within the conductor is not a solid dielectric, a suitable dielectric window, penetrable by microwaves, 9 is placed so as to fill or cover the void 7 left by the removed portion. Widen microwave power 5 from a suitably tuned generator is coupled into the cavity, it initially passes through the window and ignites a plasma 10 at the outer surface of the dielectric 9 covering the void 7, causing it to become a surface which partially reflects microwaves. Reflection returns to the interior of the conductor some of the microwave power that would have otherwise passed through the void 7. The presence of the reflected power causes wave propagation or resonance within the hollow conductor which, in turn, causes the generation of controllable plasmas over the extended surface of the dielectric.

The reflecting action of the plasma can be understood by noting that the index of refraction for microwaves traveling within a plasma is a function of the microwave frequency. Neglecting collisions, for a region that is free of magnetic fields, it is given by the formula $$n=(1-(w_p/w)^2)^{1/2}$$

where n is the index of refraction of the plasma, $w_p$ is the plasma frequency, and $w$ is the microwave frequency. The above formula states that for $w<w_p$, the index is a pure imaginary number, indicating that the plasma totally reflects the microwaves that are incident upon it, while for $w>w_p$ the index is real, indicating that the microwaves in this frequency range can propagate in the plasma without attenuation. The plasma frequency in Hz is given by $$w_p=8.98\times10^3\times(n_e)^{1/2}$$

where $n_e$ is the number of electrons in the plasma per cubic centimeter.

Now consider the situation at a point on the surface of the dielectric as the power from a microwave supply connected to the hollow conductor is increased to the point where plasma ignites at the dielectric surface. Suppose that initially the density of electrons is low so that the microwave frequency exceeds the plasma frequency. In this case the microwaves can propagate in the plasma where they can cause further ionization. As the microwave power is increased, however, the ionization increases, so that the number density of electrons increases. The plasma frequency, which is proportional to the square root of the electron density, also increases until it becomes greater than the microwave frequency and reflection occurs at the chosen point on the dielectric boundary. The microwaves are prevented from entering the plasma at that point, and the result of the reflection is that the density of microwave power inside the hollow conductor is increased. This power increase causes an increase in ionization at nearby points on the surface, so that the region on the surface of the dielectric where reflection takes place begins to propagate. As the microwave power being coupled from the generator is further increased, the reflection zone expands until it covers the entire surface.

In actuality, collisions within the plasma do occur; in fact, they are necessary in order for the plasma to be excited by the microwaves. The result is that reflection is never total, and the microwaves are only partially reflected, some of their energy being used to ionize the gas in the chamber.

Referring again to FIG. 1 if the material within the hollow conductor is a solid dielectric, the dielectric window 9 is no longer required and the plasma boundary forms at the interface between the dielectric and the material contained within the plasma vessel. The operation of the invention is fundamentally the same as above, however the dimensions of the applicator are reduced from those of a vacuum or air filled conductor. The factor by which the dimensions are reduced is equal to or greater than the index of refraction of microwaves in the dielectric. As previously noted, in an embodiment in which the applicator is based on a rectangular waveguide operated in the $TE_{1,0}$ mode, the dimension of the cross section which is parallel to the electric field may be reduced by a still greater factor. This facilitates generation of a magnetic field within the plasma by magnets mounted adjacent to the applicator.

This invention differs fundamentally from known applicators in that the reflecting properties of the plasma are required for operation of the invention. In a slow wave device, for example, propagation of a wave along the slow wave structure will occur whether or not a plasma is present. In this invention wave propagation or resonance requires that a plasma of sufficient density should exist at the outer surface of the dielectric.

That the formation of a plasma is necessary for operation of the invention is demonstrated by the action of an antenna 11 connected to a microwave detector 12 and a current-measuring device 13 as the level of microwave power 5 from a tuned source enters the aperture 8 and is steadily increased from an initial value of 0 Watts. Initially the microwave power entering the applicator will exit through the dielectric window 9. A portion of this power will be picked up by the antenna 11 and converted to a direct current by the detector 12. The current indicating device will show a current that is proportional to the power entering the applicator. The current indicated by the device will increase steadily until the power transmitting the window 9 becomes sufficient to excite a plasma at its outer surface. At the time that the plasma ignites, the current indicated by the current indicating device will show a sharp decrease and the distribution of plasma on the outer surface of the dielectric will show a pattern which is characteristic of the resonant modes which are being excited within the hollow conductor. If, for example, the applicator is terminated by a short, the drop in power being received by the antenna 11, shows that power is no longer exiting the hollow conductor through the window, and the pattern of plasma distribution on the dielectric surface shows that reflection at the dielectric surface is causing resonance within the conductor.

In some embodiments, an assembly 14 containing at least one permanent magnet is placed in the proximity of the plasma so that the magnetic field lines from the magnet will travel through the plasma in a manner, which facilitates plasma formation and which directs and intensifies the plasma after it has been ignited. In embodiments to be discussed later the compact nature of applicators having the hollow conductor filled with a dielectric allows the magnetic assembly to be placed in closer proximity to the plasma than would have been possible using prior devices, allowing stronger and more easily controlled magnetic fields to be generated within the plasma by this invention.

A further advantage of the applicator is that it allows the magnets to occupy a position outside the vacuum chamber, while remaining in close proximity to the plasma. So placed, they can easily be cooled by liquid or gaseous coolant, not shown, and thereby protected from damage by excessive temperature.

Figure 2:
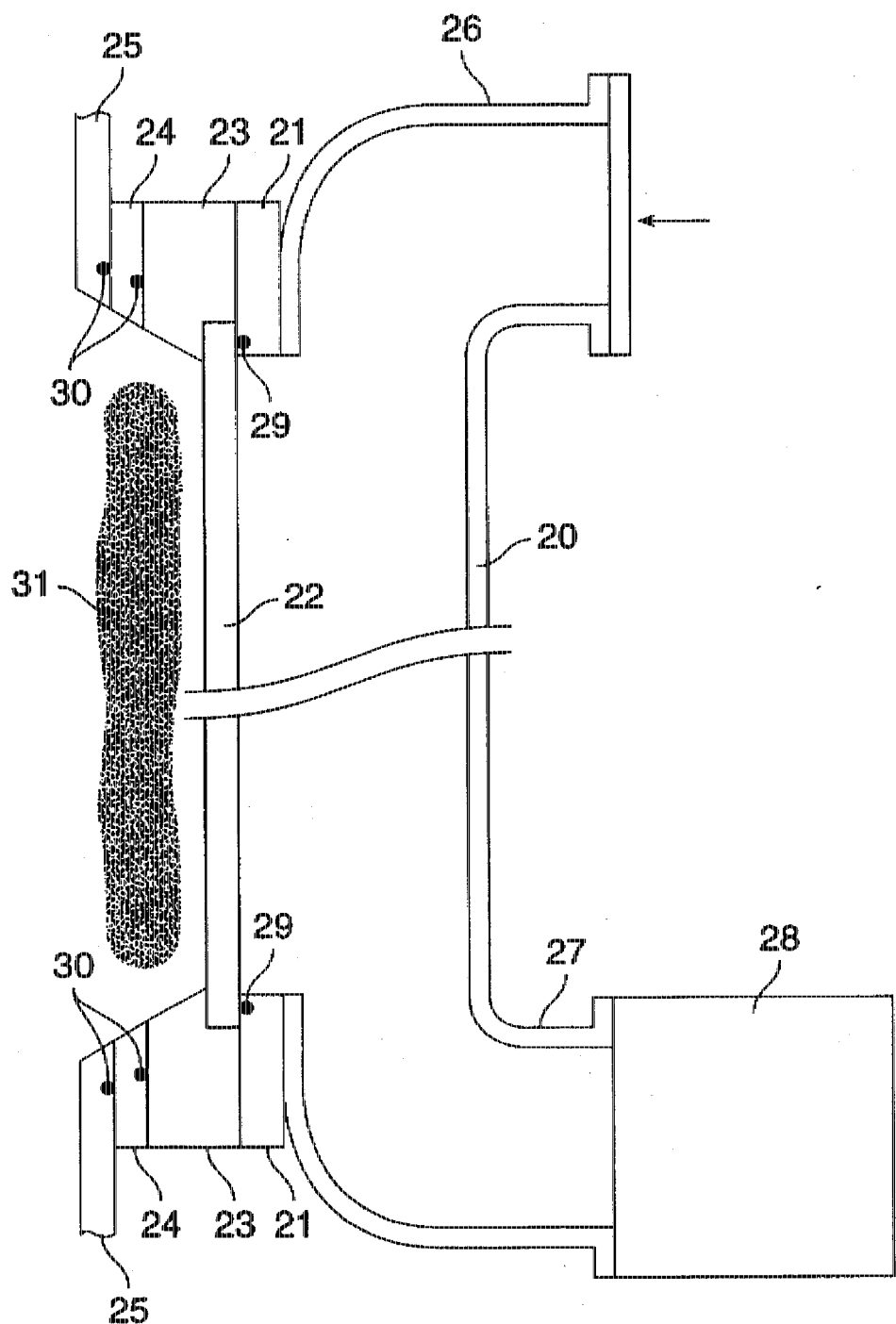
FIG. 2 is a section view of a preferred embodiment of the invention which uses a modified rectangular waveguide as a plasma applicator.

The invention consists of the use of the reflecting plasma boundary in a plasma applicator for the purpose of generating a plasma having desirable properties, and of any applicator which employs such a reflecting boundary, and the use of such an applicator in any process for the purpose of generating a plasma. A preferred embodiment of a plasma applicator which is a part of this invention is shown in FIG. 2. It consists of an assembly designed to mount on the wall of a plasma vessel where it generates a plasma having controllable properties over the large area. FIG. 2 is a section through the center of the applicator assembly.

The assembly is made up of a modified waveguide 20 of the type known to the art as WR 284 for propagating microwave power at 2.45 GHz in the $TE_{1,0}$ mode, a waveguide holder 21, a quartz window 22, a window holder 23, and an adapter 24 which is attached to the wall 25 of the vessel.

The modified waveguide consists of a straight section connected to an input section 26 and an output section 27. These are shown in FIG. 2 as elbows, but can take any convenient physical form. The larger wall of the straight section on the side adjacent to the gas in the chamber is removed, so as to leave a void through which microwaves can pass to excite a plasma.

The waveguide holder, which is mechanically attached to the waveguide, has a hole which matches the one in the waveguide. The connection between the waveguide holder and the waveguide need not be vacuum sealed. The waveguide holder is bolted to the window holder and the quartz window is secured between the window and waveguide holders so as to cover the hole in the waveguide holder if a gaseous or liquid dielectric is contained within waveguide 20. The surface of this window defines the partially-reflecting boundary which will contain the microwave energy in the guide. A vacuum seal is made by an O-ring 29 between the quartz window and the waveguide holder. Coolant is pumped through the window holder to maintain the temperature of the seal at a value low enough to avoid thermal damage to the O-ring. The adapter 24 provides a mechanical interface between the plasma chamber and the rest of the assembly. Required vacuum seals 30 are provided between the adapter and the chamber and between the adapter and the window holder.

Cooling of the waveguide structure and the window is provided by a fan, not shown, mounted on one end of the guide, which forces air into the interior of the guide through a plurality of small holes, not shown. The cooling air travels along the guide, picking up heat from the walls and the window and exiting through holes, not shown, at the other end.

When the device is operated, microwave power enters at the input section 26 and travels down the waveguide 20 toward the terminating device 28. If the power is sufficient, a plasma 31 is ignited in the volume adjacent to the quartz window. The plasma absorbs some of the microwave power and reflects a portion of it back into the guide. The reflection causes a wave to propagate toward the bottom of the guide where it continues to excite the plasma.

Figure 3:
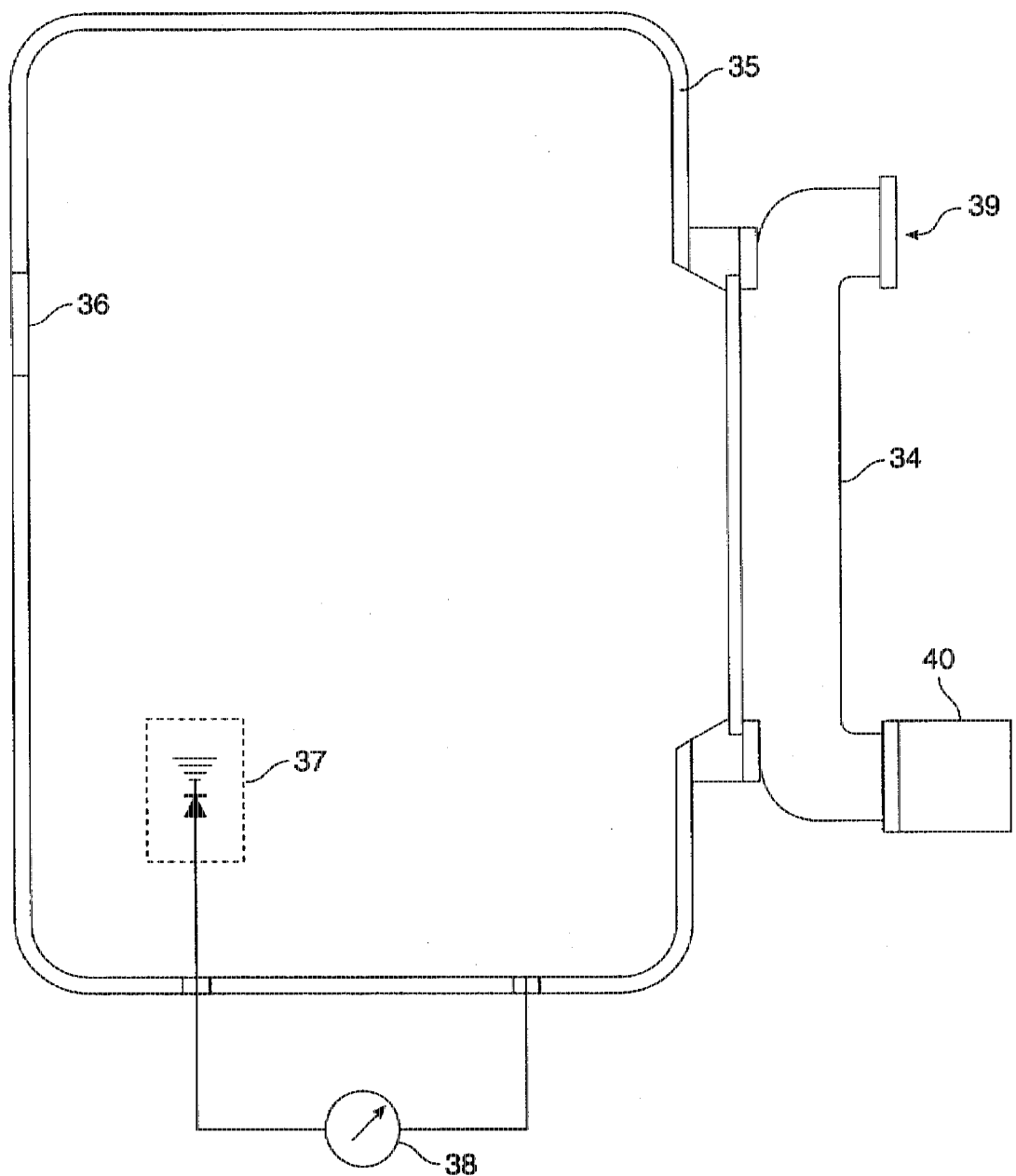
FIG. 3 is a diagram of an experimental arrangement in a plasma vessel which demonstrates the operation of the device.

FIG. 3 shows how the microwave plasma guides the energy in the applicator, setting up a standing wave pattern in the embodiment shown in FIG. 2. A microwave applicator 34 of the type shown in FIG. 2 is shown mounted on the wall of the plasma vessel 35. A viewport 36 in the side of the plasma vessel opposite to the applicator is provided so that the plasma can be observed visually. As in FIG. 1, an antenna with detector 37 is placed inside the vessel to pick up microwave radiation. The power absorbed by the antenna results in a direct current which is then measured by the current indicating device 38.

Microwave power 39 is applied at the input of the applicator so as to increase steadily from a starting value of 0 Watts. Initially, an observer viewing the applicator through the port does not see a glow emanating from the space in front of it, indicating that the plasma has not yet been excited. The current indicating device, which provides a measure of microwave power that is being transferred into the vacuum vessel from the applicator shows that the power being transferred into the chamber is proportional to the amount entering the input port of the applicator. As the power is further increased, a threshold power level is reached and the observer at the viewport sees a glow emanating from the space in front of the quartz window. The glow is caused by excited states within the plasma being generated by the microwave field. Due to diffusion of the plasma into the chamber volume, the glow exists in an extended region around the applicator; however, its intensity decreases as distance from the window increases.

At the same time that the plasma ignites, the level of microwave power in the chamber as measured by the current indicating device is seen to drop to a value which is typically less than 1% of its pre-threshold value. This clearly indicates that almost all of the microwave power which in the absence of the plasma would have entered the chamber is either being contained within the guide or absorbed by the plasma.

To show that a substantial amount of power is contained within the guide, it is only necessary to use a reflecting metal plate to form the terminating device 40 in FIG. 3 and repeat the above observations. The observer looking through the port sees a number of bright bands located at regular intervals along the quartz plate. The locations of these bands correspond to the locations of voltage maxima caused by standing waves. The presence of these standing waves shows that there is a resonance in the cavity created by the tuner and the terminating short circuit, causing power to travel back and forth through the entire length of the guide. The standing waves are made possible due to containment of the microwave power by the conducting plasma. This is a further example of the process described in the previous discussion of FIG. 1.

This embodiment normally uses a tuning device to provide maximum power coupling from the microwave generator. It also has detectors for separately measuring microwave power traveling into the waveguide and being reflected back from the tuner. When the applicator is operating with the quartz window facing an open chamber, the ratio of forward to reverse power at the input typically exceeds 10 to 1, indicating that more than 90% of the microwave power is absorbed in the round trip through the device, or in the tuner.

As seen from the above discussion of standing waves, variations in plasma density with position along the longitudinal dimension of the applicator occur due to variations in the electric field intensity. The variations are not desirable for many applications. They are reduced below what one might expect in a standard leaky waveguide, because of increased reflection back into the applicator at locations where the internal field is high. At locations which are removed from the dielectric boundary the variations are further reduced by diffusion, in much the same fashion as variations in light from a diffuse source would be reduced, becoming substantially attenuated as the distance from the window becomes greater than the scale of the variation. For some applications such as those in which the plasma is used to cause a chemical reaction between active species in the plasma and atoms on the substrate, uniformity is not a critical requirement, since it is only necessary to assure that the plasma density at all points on the substrate exceeds some level that is necessary to achieve a complete reaction. For applications where greater uniformity is required, other embodiments discussed herein are recommended.

Figure 4:
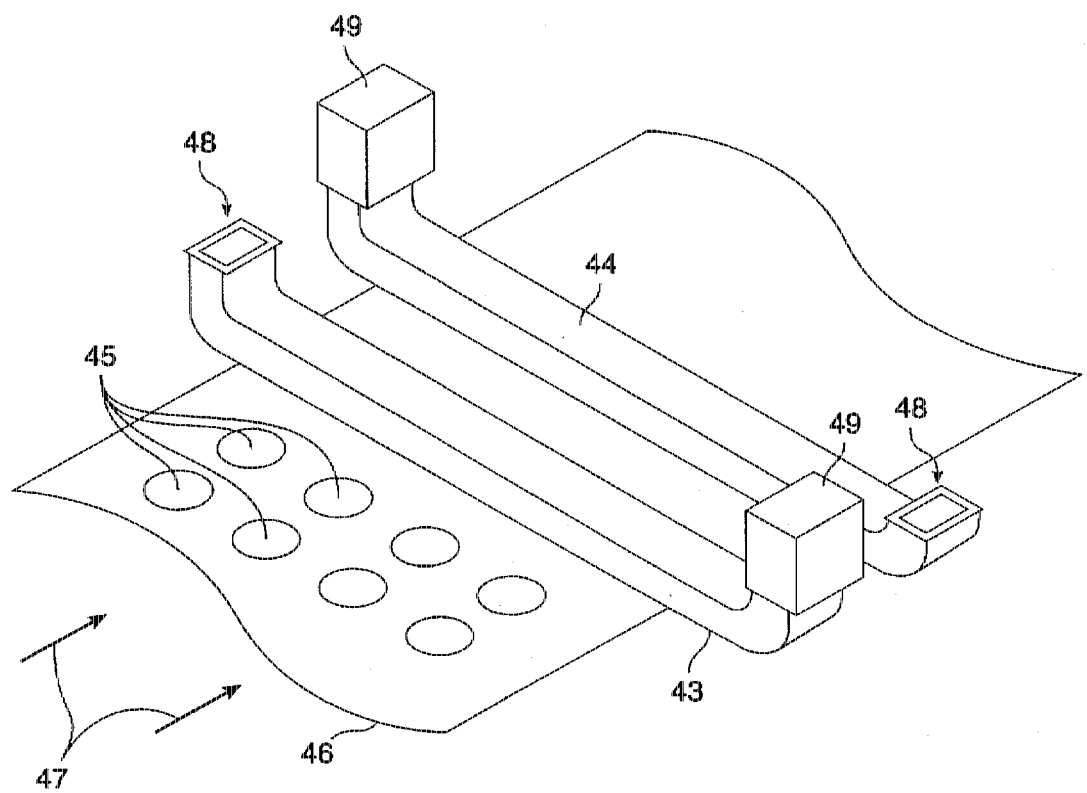
FIG. 4 is a perspective of a second preferred embodiment, in which two adjacent applicators are placed so that their axes are parallel and the microwave energy travels in opposite directions.

FIG. 4 shows an embodiment which produces a plasma having greater uniformity of exposure of substrates to the generated plasma than the embodiment just discussed. Two devices 43,44 like those of the previous embodiment are mounted on a chamber wall (not shown) with the axes of their waveguide structures parallel. So mounted, they are in a position to produce a plasma which will exist in the vicinity of substrates 45 moving on a conveying device 46 perpendicular to the waveguide axes as indicated by the arrows 47. The conveying device could be a belt or a drum, or there could be a continuous web of material in place of the belt which forms the substrate to be exposed to the plasma. Microwave power 48 enters each of the applicators so as to travel transverse to the motion of the conveying device to a termination on the opposite end. The flow of power in the two guides takes place along parallel lines, but the direction of flow in one guide is opposite to the direction of flow in the other.

The electric field in each applicator, and hence the density of plasma that it excites, will vary as a function of the distance from the point of introduction to the point under consideration. Because of the opposite direction of motion of the microwaves in the two guides, the points of introduction are on opposite ends, so that the intensity of the plasma measured at points equidistant from a line perpendicular to the waveguides and passing through their centers will be the same for the two applicators. The exposure of the substrates results from the sum of the exposures from each of the two applicators as the substrates move under the applicators. Because of the antisymmetry discussed above, one of the components in the sum varies with distance across the conveying device in the opposite direction as the other, making the sum more uniform than either component. Thus the arrangement in FIG. 4 produces a more uniform plasma. In this embodiment, the termination 49 of the applicators can take various forms.

As we have seen, a short circuit which could consist of a metal plate, has the advantage that it reflects power back into the cavity. This causes coupling of microwave power to be more efficient than when a dummy load is used as a termination. The effects of standing waves caused by the reflection can be reduced by providing instead of a metal plate a movable plunger or other reflecting phase shifter which, when adjusted, causes the standing wave pattern to be displaced with respect to the other through one or more spatial cycles. When the adjustment is such that the intensity peaks of one applicator line up with the troughs in the other, the overall plasma density, which is proportional to the sum of the two components, will be uniform. During the adjustment of the location of one standing wave pattern with respect to the other, the input tuner connected to the applicator which is being adjusted must also be adjusted to achieve the highest available coupling efficiency.

Figure 5:
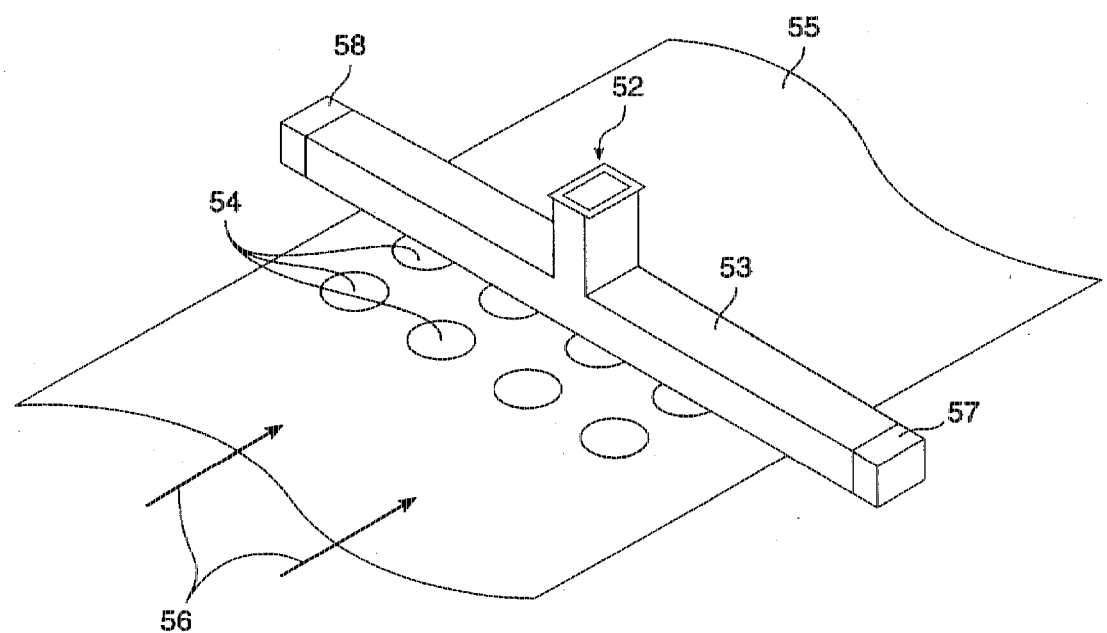
FIG. 5 shows a perspective of a third embodiment using a "T" configuration.

FIG. 5 shows another embodiment which provides a spatial distribution of plasma generation that is symmetrical with respect to a line which is perpendicular to the axis of the applicator and which passes through its center so as to form a connection in the shape of the letter "T". In this embodiment microwaves shown by the arrow 52 are introduced into the applicator 53 at a point on the line of symmetry. As in the embodiment of FIG. 4 substrates 54 are conveyed by a device 55 such as a belt, drum or web in the direction of the arrows 56 so as to move under the applicator in a direction perpendicular to its long axis. Microwaves enter the applicator at the T connection and travel outward toward both of its extremities toward the terminations 57,58 on either end. The surface, not shown, in whose vicinity the plasma is generated lies between the applicator and the moving substrates. The pattern of electromagnetic standing waves in the applicator, and the corresponding pattern of plasma generation will be symmetrically disposed with respect to the center of the applicator. Attenuation of the pattern that increases with the distance along the applicator from the point of introduction of the microwaves will be less than would be the case in an embodiment in which the microwaves were introduced at one end of the applicator. This is due to the shorter distance of travel of the microwaves from their point of introduction.

Figure 6A:
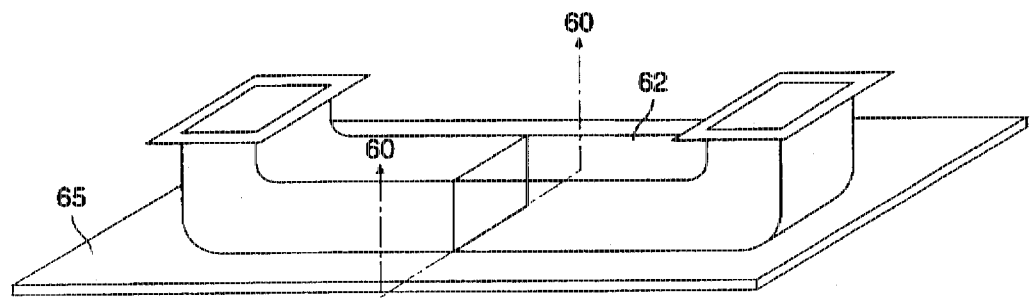
FIG. 6a is a cross-section view taken along line A—A of FIG. 6.

FIG. 6 and 6a show another embodiment of the applicator in which the dielectric window has been removed and the volume defined by the metal walls of the waveguide has been filled by a solid dielectric 61. The metal walls of the waveguide 62 have been thickened to allow room for channels 63 which carry coolant. Since a vacuum seal for the dielectric is not required, the seal 64 is made between the metal portion of the waveguide and the chamber wall 65. At this location of the seal the temperature can easily be kept low enough to avoid damaging the seal. The waveguide shown is FIG. 6 can be smaller than the standard WR 284 air-filled guide shown in FIG. 2. The dimension a in FIG. 6a is reduced by a factor equal to the index of refraction of the dielectric so that the cutoff wavelength is unchanged and only the $TE_{1,0}$ mode can propagate. The dimension b, which is parallel to the electric field may be reduced by a greater factor, whose size is limited only by the electrical breakdown strength of the dielectric in the guide. This results in a more compact applicator design with higher fields at the dielectric/plasma boundary.

Suitable dielectric materials for use within the applicator are those which are refractory, have a high degree of spatial uniformity, are non-absorptive to the microwave energy within them, and have a high electrical breakdown strength. Examples of such materials are fused silica, which has an index of refraction of 2.0 at 2.5 Ghz and aluminum oxide which has an index of refraction of 3.0 at the same frequency.

Figure 6B:
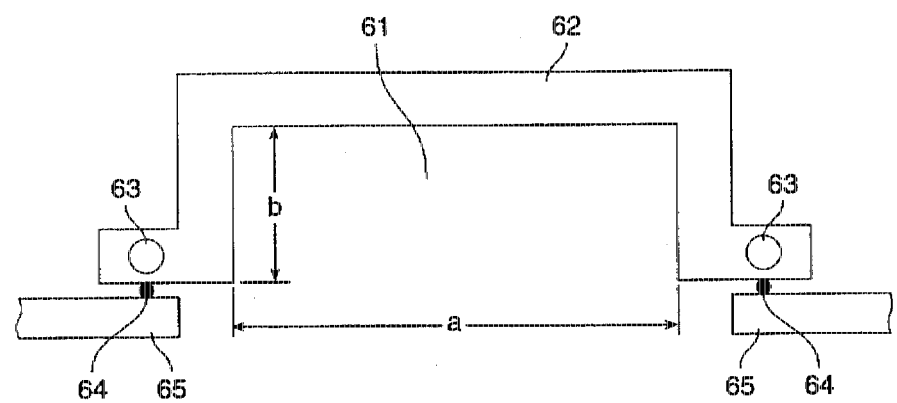
FIG. 6 shows in perspective another embodiment of the invention in which a dielectric window is replaced by a dielectric block that fills the interior of the guide.
Figure 7:
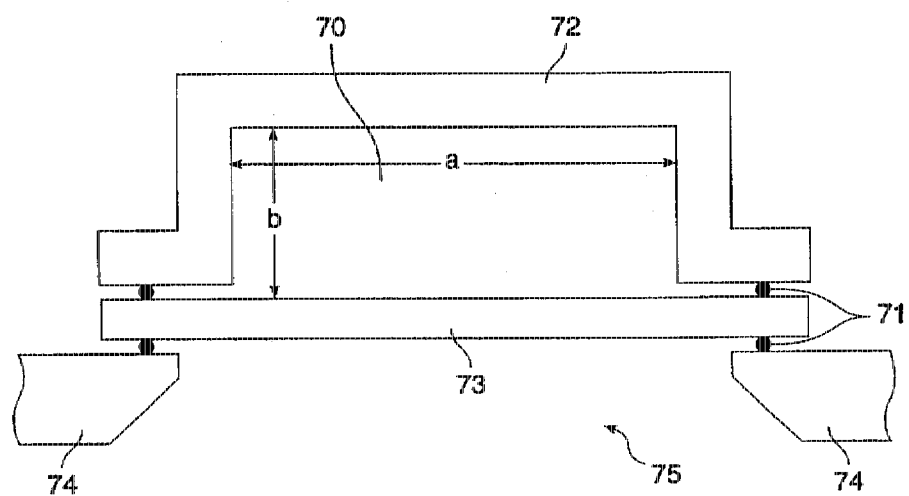
FIG. 7 Shows a cross section of another embodiment in which the interior of the applicator is filled with a dielectric liquid.

In FIG. 7 a cross section of a preferred embodiment is shown in which the waveguide portion of the applicator is filled with a dielectric liquid 70. The liquid is pumped through the guide and serves as a coolant. The construction and operation of this embodiment is similar to the embodiment shown in FIG. 2, however as in the embodiment of FIG. 6, the dimension a is reduced by a factor equal to the index of refraction of the liquid, and the dimension b may adjusted to meet the requirements of a particular application. Two liquids which are suitable are dimethyl polysiloxane and commercially available hydraulic fluid.

Seals 71 are shown schematically between the waveguide metallic component 72, the solid dielectric plate, 73, and the walls of the plasma chamber 74. The seals may take any form. In particular, the seal between the metal and the dielectric parts of the applicator could be formed from a permanent adhesive.

In this embodiment, the walls of the plasma chamber have been beveled to allow a volume 75 for formation and propagation of the plasma.

Figure 8:
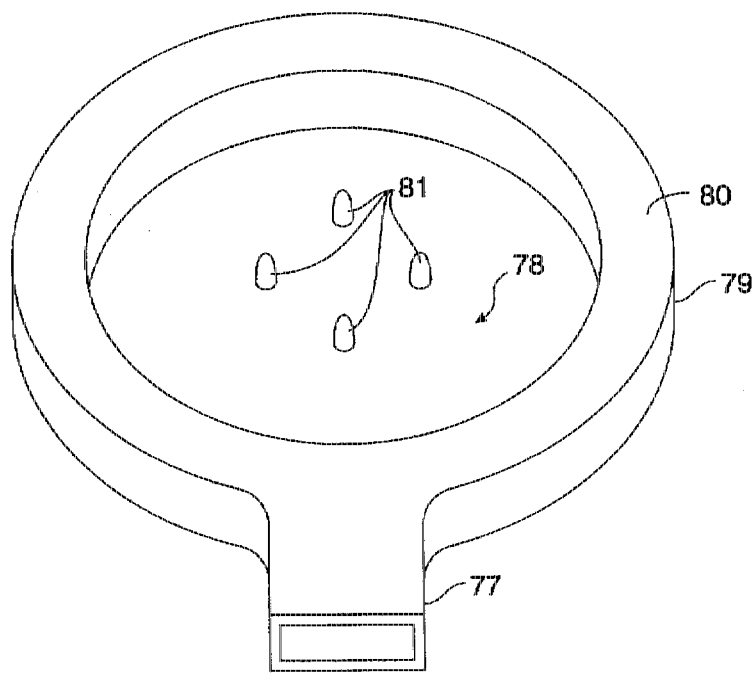
FIG. 8 is a perspective of a cylindrical resonant structure of the present invention.

The embodiment shown in FIG. 8 is an example in which the conducting plasma forms one of the boundaries of a resonant cavity. The cavity that is shown is a short section of a cylinder, so that seen in plan it is circular in shape. It can have any shape which is convenient for a given application. Power is fed into it by at least one microwave feed structure 77, which is shown schematically as a waveguide. The bottom 78 and sides 79 of the cavity are made of metal and the top is covered by a dielectric window as in the embodiment of FIG. 2, and FIG. 7, or the dielectric window is omitted and the cavity is filled by a dielectric as in the embodiment of FIG. 6. FIG. 8 shows an embodiment in which the cavity is filled with a fluid when operating. The top dielectric plate has been removed and a flange 80 for mounting it is shown.

When the cavity is excited, a plasma is ignited at the outer surface of the dielectric so that the previously open structure takes on properties resembling those of a closed cavity. The large area of the interface between the cavity and the plasma implies that a considerable volume of plasma can be generated by the device, making it applicable to a process in which a large substrate needs to be exposed to a plasma.

As in the embodiment of FIG. 6, the resonator can be operated in a $TE_{1,0}$ mode so that the dimension of the cavity that is parallel to the electric field can be reduced until the breakdown strength of the material in the applicator is exceeded.

Figure 8A:
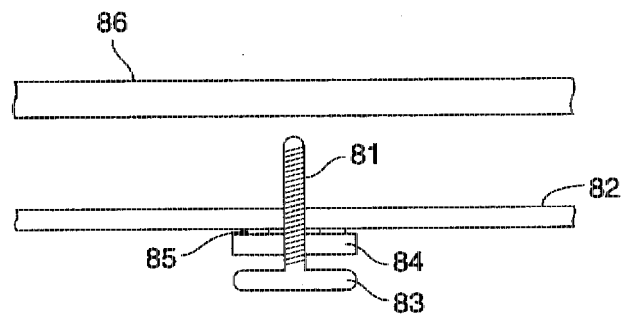
FIG. 8a is a cross sectional view of an adjustable stub for use in the applicator of FIG. 8.

Because of losses incurred by the excitation of the plasma, the modes are broadened in frequency and resonance in the cavity is suppressed. When the microwave generator is coupled for maximum power transfer into the device, a complex pattern of standing waves is generated at the dielectric surface. The pattern is adjusted to have desired properties by means of reflecting structures 81. These structures can take various forms which are known to those practiced in the art of microwave technology. They are shown as adjustable conducting stubs which enter the resonant cavity from the bottom. In FIG. 8 four such stubs are shown, however the actual number and location of stubs will depend on the application. FIG. 8a shows a cross section of one arrangement by means of which an adjustable stub could be installed on the resonator wall. The cylindrical stub 81 is threaded along its length. The bottom wall 82 of the applicator has a hole that is correspondingly threaded so that the stub can be screwed into the wall and adjusted to the desired length by turning it with the handle 83. When the desired length has been achieved, the stub is secured in place by tightening the nut 84 against the washer 85. FIG. 8a shows an embodiment in which the medium within the applicator is air so that a dielectric plate 86 is shown above the post. If a solid dielectric were used the plate would be omitted and a recess within it would be provided for the stub.

Figure 8B:
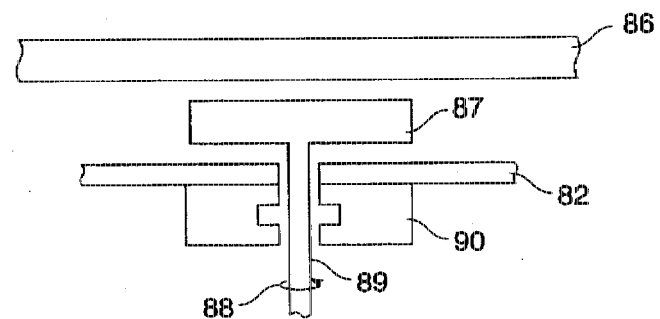
FIG. 8b is a cross sectional view of a rotary mode mixer for use with the applicator of FIG. 8.

Another way to achieve uniformity is to vary the configuration of the resonant structure in time so that while a standing wave pattern causes spatial nonuniformity of the plasma generated by the applicator at a given instant of time, the pattern can be caused to vary rapidly enough so that when the rate of generation is averaged over the time of substrate exposure, it becomes uniform. To achieve this rapid variation of the wave pattern, the cavity configuration may be caused to change with time. Variation of the cavity configuration can be achieved by installing rotating mode mixers, such as is shown in cross section in FIG. 8b, within the cavity. Referring to FIG. 8b, the rotating mode mixer 87 is installed between the top dielectric 86 and the bottom wall 82 of the applicator. Rotation of the mode mixer, shown by the arrow 88 is achieved by turning the shaft 89 that is connected to the mode mixer. Microwave power is prevented from escaping out of the cavity by a slotted microwave choke 90, a device which is well known. The plan view of the mixer will have a generally irregular shape whose details depend on the application. When the shaft is rotated the mode mixer also rotates so as to change the geometric relation of conductors within the applicator and thereby varying the pattern of standing waves at the upper surface of the top dielectric. As in FIG. 8a an embodiment in which the applicator is air filled is shown. For an applicator filled with solid dielectric the dielectric would be suitably recessed to allow movement of the mixer. Bearings to allow rotation while holding the shaft in the center of the microwave choke as well as a suitable source of rotary motion are required.

Another way to cause the desired time variation of the standing wave pattern is to provide multiple input ports to the applicator and switch the microwave generator between them. The pattern of plasma generation seen by the substrate would then be the average of that seen when the generator was connected to each port, which would be more uniform than that seen if only one port had been used.

Magnetic fields enhance the production of plasma by microwave excitation. Furthermore, a magnetic field can influence the propagation of plasma in the region of the field. The result of these two factors is that a magnetic field can be used to produce an intense plasma in a controlled location. The coupling of energy can be further enhanced by providing a magnetic field of the proper strength to cause a phenomenon known as electron cyclotron resonance (ECR). For ECR to occur, the frequency of rotation of an electron in the magnetic field must equal the frequency of the applied microwave radiation. ECR at 2.45 GHz requires a magnetic field of 874 Gauss.

Magnetic fields in the plasma region can be provided by a suitable configuration of permanent magnets at proper locations. The present art favors the use of NdFeB permanent magnets for this purpose; however these magnets are destroyed by temperatures exceeding 100 C, so that cooling must be provided if they are placed in the vicinity of a hot plasma.

The embodiments shown in FIG. 2, FIG. 6, FIG. 7, and FIG. 8 all support electromagnetic modes in which the E field is constant across the short dimension of the containing structure. For this reason, the length of the short dimension may be decreased until the electric field in the material within the applicator exceeds a value which would cause electrical breakdown. In the embodiments of FIG. 6, FIG. 7, and FIG. 8, the containing structure is filled with a dielectric. If a dielectric such as fused quartz, which has a high breakdown field, is chosen, the short dimension of the containment volume could be reduced to less then 0.5 inches. In such a situation a configuration of permanent magnets could be placed close to the back side of the applicator. So placed, it could provide the required field in the plasma volume while being thermally isolated from the hot plasma volume within the chamber. Since the magnets would be outside of the plasma volume, it would be easy to provide a flow of air or liquid coolant to maintain the magnets at a temperature low enough to avoid damaging them.

Figure 9:
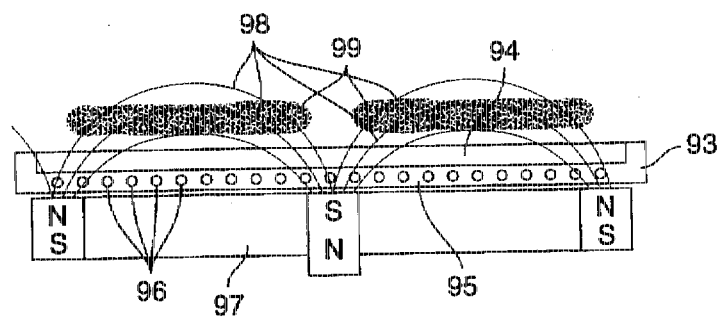
FIG. 9 is a vertical section through the line A—A of FIG. 8 showing one way to introduce a strong magnetic field into the plasma.

FIG. 9 is an embodiment of the invention in which a strong magnetic field is introduced into the volume of an applicator as described above. The applicator 93 is a cylindrical resonant structure of the form shown in FIG. 8 and is filled with a solid dielectric 94. FIG. 9 shows a vertical section through the center of the resonator. The conducting portion of the resonant cavity has a thickened bottom plate 95 with holes 96 for coolant. A configuration consisting of at least one permanent magnet 97 is placed adjacent to the bottom plate. FIG. 9 depicts an assembly in which a single strong magnet located below the center of the circular applicator is surrounded by a circular ring comprising a plurality of magnets. The magnets in the ring have their poles in the opposite vertical orientation from the one at the center so that magnetic lines of force 98 traverse the region above and between the magnets, including the region where the plasma is being formed. The plasma is intensified in the region containing the magnetic field and is particularly intensified in the region 99 where the magnitude of the magnetic field is in the neighborhood of 874 Gauss and ECR occurs.

The relative strengths of the magnets at the center and periphery of the ring can be adjusted in order to meet the requirements of a given process. Also the configuration of magnets can consist of a single piece of magnetic material which is circular in plan which has raised pole pieces at the center and outer edge. The polarity of the center pole piece and the outer ring would be opposite.

Figure 10:
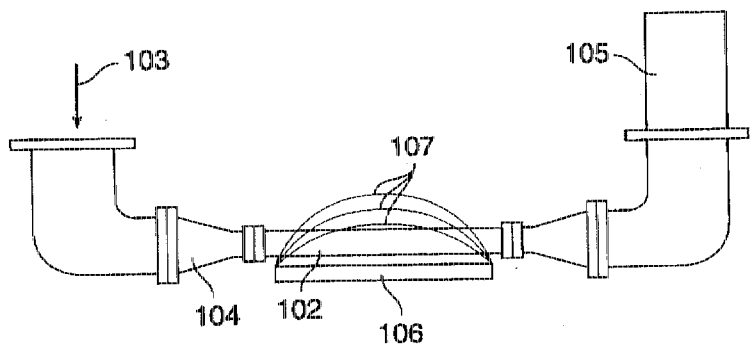
FIG. 10 shows in plan an embodiment using the applicator of FIG. 6 in conjunction with an axially aligned bar magnet.

Another embodiment of the invention is shown in FIG. 10. In this embodiment the applicator takes the form shown in FIG. 6 in which a rectangular waveguide applicator 102 is filled with a dielectric slab. Microwaves 103 from a generator and tuner enter an input coupler 104 which introduces them into the applicator. They ignite a plasma at the boundary of the dielectric, which confines them to the dielectric. They then exit through the output coupler and interact with the termination device 105 where they may be absorbed, or partially reflected. Coolant, not shown, is pumped through the metal walls of the applicator.

An elongated bar magnet 106, which may be assembled from a plurality of smaller magnets, is placed beneath and adjacent to the cooled applicator. Because of the reduced width of the applicator when compared to prior art, the magnet may be moved to a location which is close to the plasma. Therefore, the magnetic field lines 107 penetrate the applicator and enter the plasma, bringing about enhancements of the plasma properties which are similar to those obtained with the previous embodiment.

The configurations shown in FIG. 9 and FIG. 10 are representative of the physical arrangements including a plurality of magnets and actuators which may be used to adapt this invention to particular process applications.

Figure 11:
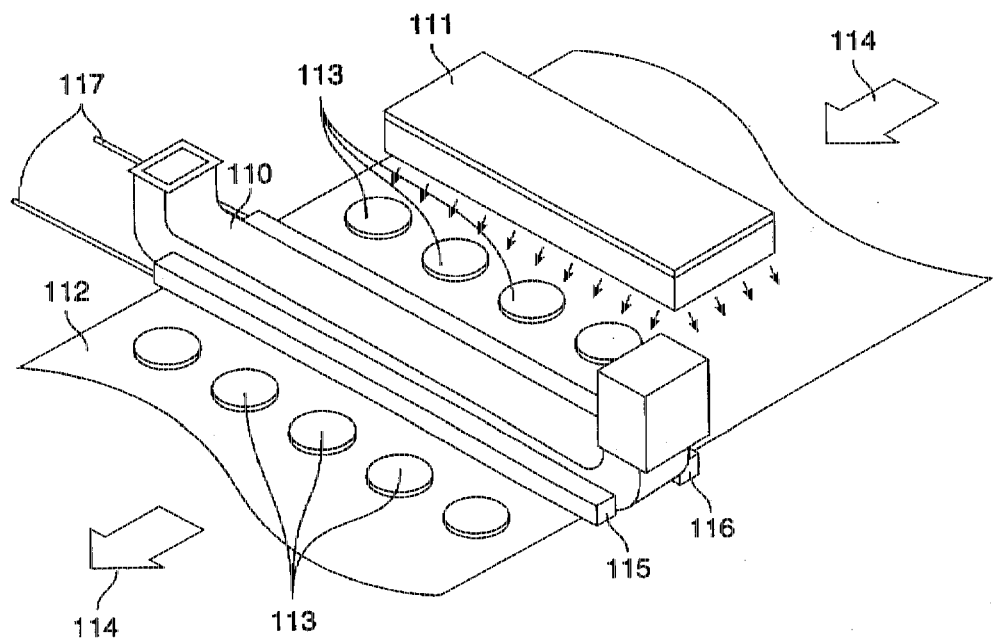
FIG. 11 shows in perspective an arrangement which uses the invention to improve a reactive sputtering process.

FIG. 11 shows a configuration which uses the present invention to improve a process for reactive sputtering of insulating coatings on substrates. The components of the apparatus are mounted on the walls of or within a sputtering chamber in which there is a mixture of gases at a pressure of approximately 1 mtorr. The chamber contains a sputtering gas which is usually argon and a reactant gas which combines with material that is sputtered on the target to form the desired coating. Oxygen and nitrogen are the most commonly used reactant gases. During the sputtering process the partial pressures of the sputtering and reactant gases must be controlled to achieve proper results. Also, proper flow of the gases within the chamber is important.

Referring to FIG. 11, a plasma applicator 110 of the type shown in FIG. 2 or FIGS. 6 and 7 and a magnetron sputtering target 111 are mounted on the top wall, not shown, of a sputtering chamber above a conveying mechanism 112 such as a belt, drum or web which transports substrates 113 in the direction shown by arrows 114. The long axes of the sputtering target and the plasma applicator are oriented to be perpendicular to the motion of and parallel to the surface of the conveying device.

The substrates are transported under the sputtering target where they receive a coating of sputtered material such as silicon or titanium. They then pass through an extended region on either side of the plasma applicator where the deposited material reacts with a reactive species to form a coating with the desired composition and properties. Reactive species consist of ionized, excited or monatomic forms of the reactant gas. These are formed in the intense region of the plasma at the surface of the applicator by collisions between electrons and molecules of reactant gas when microwave power shown by the arrow 68 excites the applicator. To achieve a high rate of formation of oxide or nitride at the substrate surface it is essential to create a high rate of formation of the reactant species. Since the rate of generation of the reactive species is proportional to the concentration of reactant gas at the chamber/applicator interface, it is desirable to maximize the concentration of reactant gas at the interface. For this reason manifolds 115,116 are provided at either side of the base of the applicator. Oxygen or nitrogen, depending on the coating that is being formed on the substrate is fed to the manifold by means of the tubes 117.

The sputtering arrangement shown in FIG. 11 employed only a single applicator. Others could employ a plurality of applicators. Embodiments of applicators like those shown in FIG. 9 and FIG. 10 in which the plasma is enhanced by the magnetic field or by electron cyclotron resonance produced by the interaction of the microwaves with the magnetic field are particularly effective in producing a high concentration of reactive species. Monatomic oxygen or nitrogen atoms produced by electron-atom collisions within the plasma are uncharged and therefore can freely diffuse out of the magnetic field and react with deposited material on the surface of the substrate.

A configuration similar to that shown in FIG. 11 can be used to improve a deposition process which uses at least one device known to the art as an E-beam source in place of the sputtering target 111 to evaporate material such as silicon or titanium onto the surface of the substrates 113. The E-beam sources are placed in the same location as the target 64 and other features of FIG. 11 remain generally as shown. Material evaporated from the E-beam sources is deposited on the substrates and then combines with activated species as it passes under the applicator 63. As with the embodiment which employed a sputtering target, enhancement in the rate of reaction at the substrate surface is achieved over that which has previously been achievable.

Figure 12:
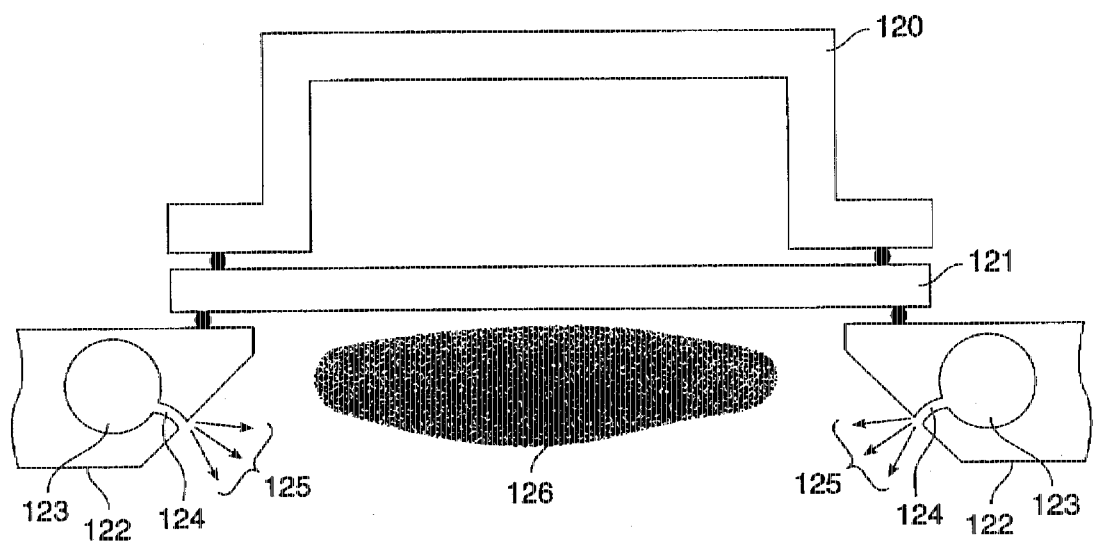
FIG. 12 shows in section an embodiment of the invention directed to reactive sputtering in which a manifold attached to an applicator conveys a reactive gas into the region of plasma generation.

FIG. 12 shows a cross section of one embodiment of the applicator which operates in conjunction with adjacent manifolds. A rectangular waveguide 120 is sealed to a dielectric plate 121 which is in turn sealed to the walls 122 of the plasma vessel. To convey the reactive gas, the walls of the plasma chamber or mounting plates adjacent to the applicator contain at least one manifold 123. Each manifold is connected to a supply of reactive gas which flows through the manifold and is distributed to the region of plasma generation by a plurality of orifices 124, two of which are shown, in the manifold. The flow of gas from the orifices into the volume of plasma generation is shown by the arrows 125. In the region 126 the reactive gas is transformed into an activated form. Some of the activated gas then diffuses away from the applicator into the vicinity of the substrate surface where it reacts with a coating that is being deposited on the substrate. The use of the manifold in conjunction with the activator provides a high concentration of activated species of the surface of the substrate, enabling deposition to proceed at a higher rate than would be possible using prior art.

Figure 13:
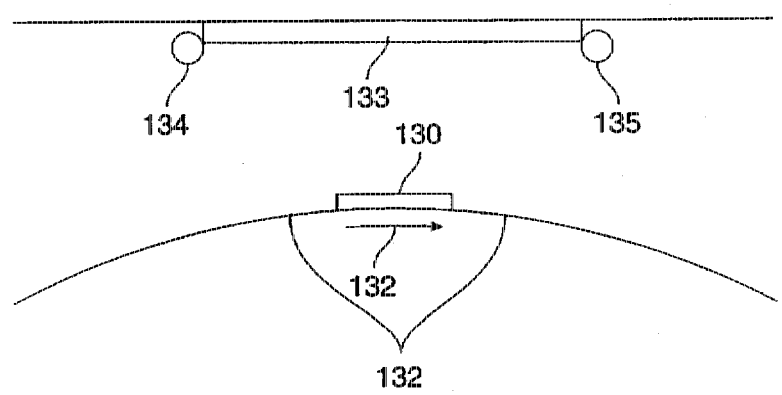
FIG. 13 is a cross-sectional schematic showing the invention being used to generate a plasma in a chemical vapor deposition process.
Figure 3:
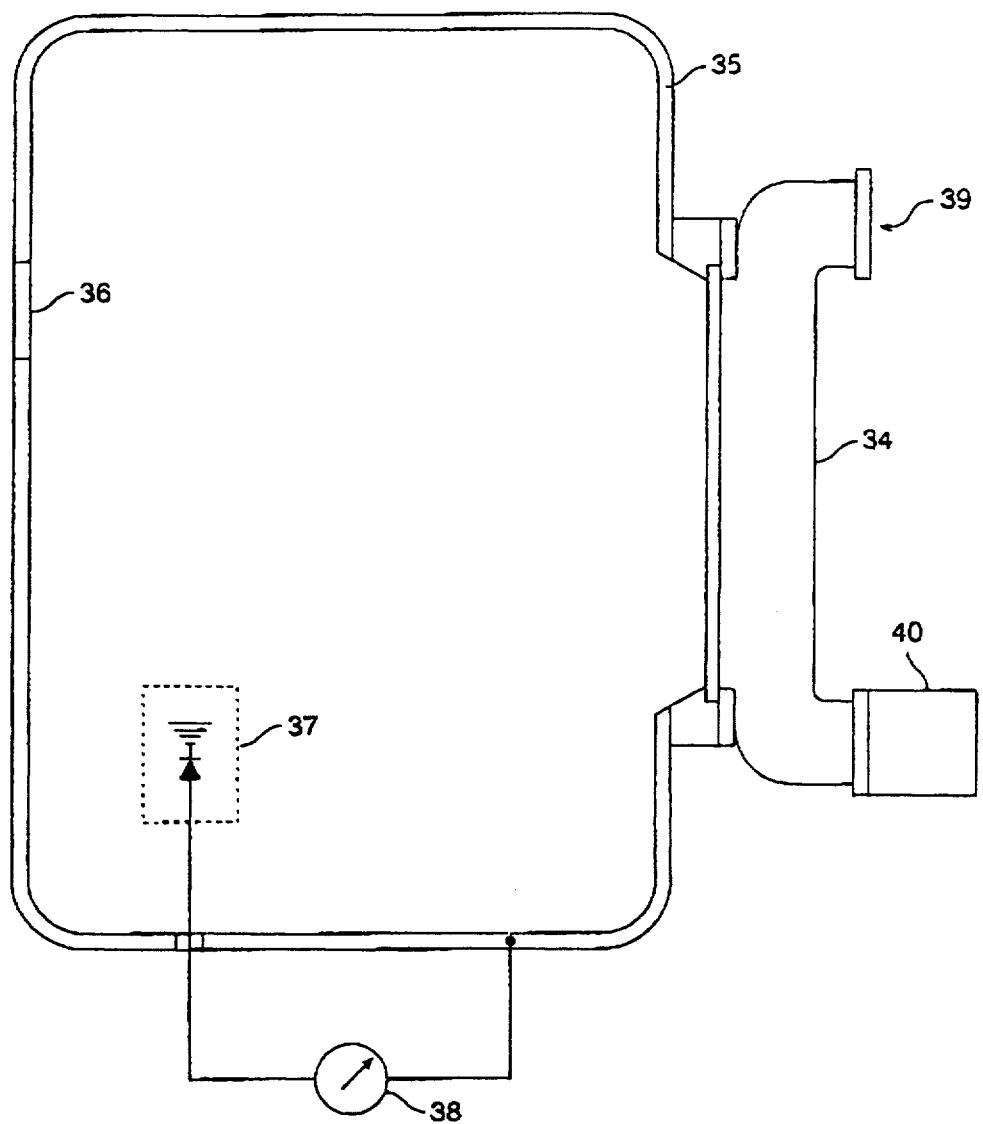
Figure 6A:
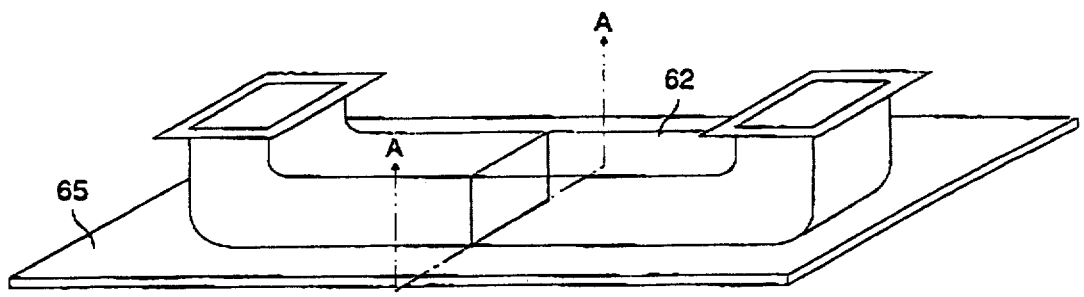
Figure 6B:
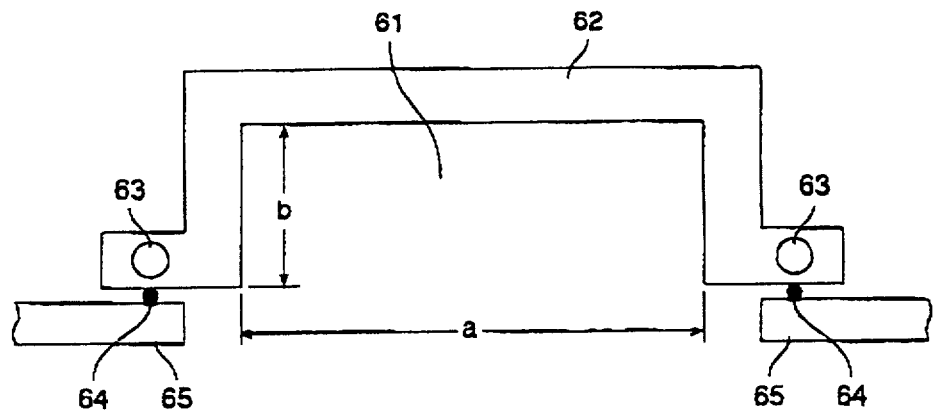
Figure 7:
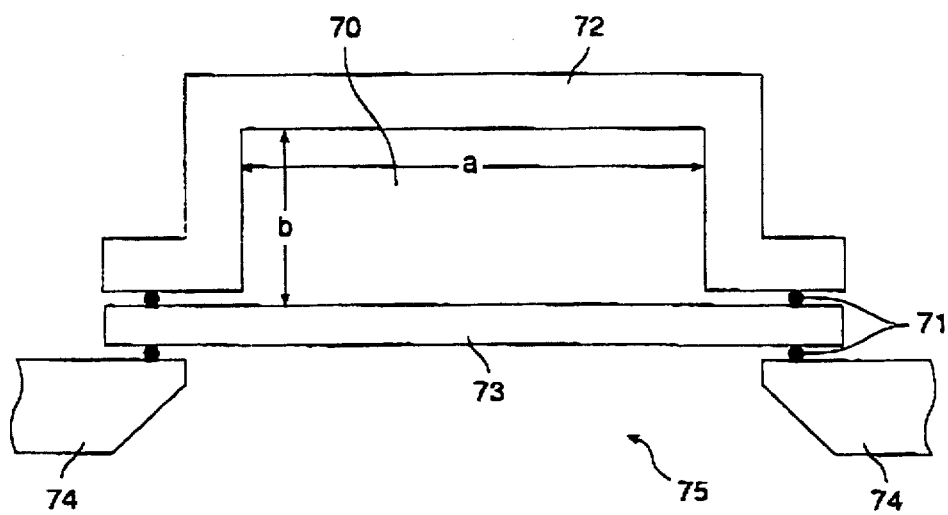
Figure 12:
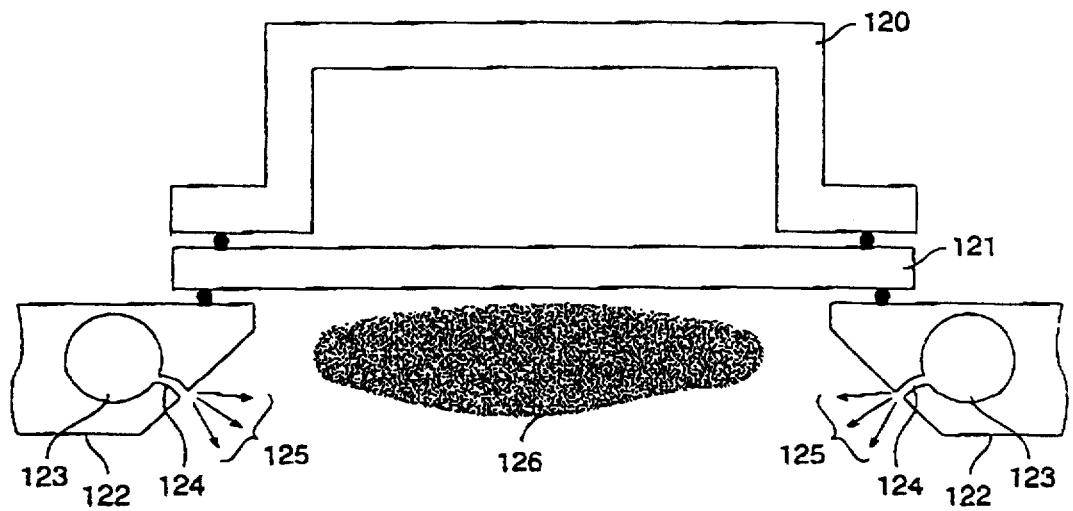
Figure 13:
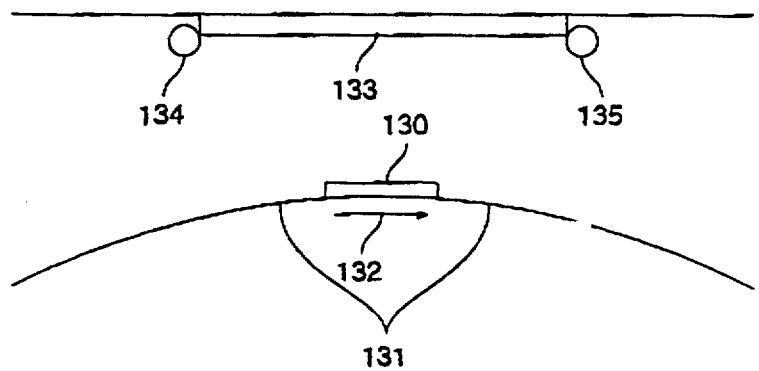

FIG. 13 is a schematic of an arrangement in which the invention is used for chemical vapor deposition (CVD). In CVD deposition of a material, for example silicon dioxide is accomplished by causing a chemical reaction to occur on the surface of the substrate. The reaction occurs between species which exist entirely in the gaseous environment of the chamber, rather than between a deposited material and a reactive species as in reactive sputtering. Referring to FIG. 13, a substrate 130 is transported by a transporting device 131 in the direction of the arrow 132 so as to move under a plasma applicator 133. Chemical reactants, such as silicon tetrachloride and molecular oxygen, are distributed into the chamber atmosphere by manifolds 134,135 or other devices having suitably placed orifices for introducing the reactants into the region below and adjacent to the applicator. Reactive species are formed from the reactants by the action of the plasma generated by the applicator. These species then diffuse to the substrate surface where they combine to form a desired coating (silicon dioxide, in the case of the reactants cited above) on the substrate surface. Another example of the use of CVD is the deposition of titanium dioxide starting with titanium tetrachloride and molecular oxygen as reactants.

The configuration shown in FIG. 11 is an example to be used for illustrative purposes. Other configurations which use the applicator to achieve a high concentration of reactive species at the substrate surface are possible. These differ in detail from FIG. 11 but use the same principle in order to achieve a high rate of reaction at the substrate surface. For example, a manifold for conveying the reactive gas which is integral with the applicator is shown in FIG. 1. While this arrangement may be preferable for many applications, it may not be desirable in all applications, and therefore other arrangements for conveying reactant gases may be used with this invention.

The present invention may be applied to plasma etching processes. Such processes are described in many references, such as *Plasma Etching* edited by Manos and Flamm, Academic Press, 1989. Such process may employ plasmas to create reactive species which travel to a substrate and react with it, gassifying its surface in regions where it is not protected by a mask. They may also remove material from a substrate by accelerating ions in a plasma and causing them to bombard the substrate to be etched, thereby removing material from unprotected regions of the substrate by sputtering. Many processes employ a combination of sputtering and gassification to perform etching. Control of the spatial distribution and enhancement of the intensity of plasmas used for plasma etching is often achieved by introduction of magnetic fields into the region of plasma formation.

The present invention in the embodiments of FIGS. 2, 4, 5, 6, 7, 8, 9, 10, 11, 12, and 13 may be adapted to generate plasma to meet the range of requirements encountered in plasma etching processes. It can generate a high density plasma in a large volume whose shape may be made optimum for a particular etching geometry. Use of thin applicators which may be filled with dielectric together with an adjacent magnet pack can provide higher density plasmas than are currently achievable, enabling a corresponding increase in etch rates.

The embodiments shown in FIGS. 2, 4, 5, 6, 7, 8, 9, 10, and 11 can be applied at any microwave frequency by scaling the physical dimensions of the microwave components in proportion to the free-space wavelength of the microwaves. While the particular frequency, 2.45 GHz, is in common use within the sputtering industry, the devices and method disclosed herein may be used with microwaves having any frequency. In particular, they could be used at a frequency of 910 MHz, especially in large scale industrial processes in which the larger size of the components could be advantageous.

I claim:

1. A device comprising a long rectangular waveguide mounted within a reaction chamber wherein one of the four walls of said waveguide has been removed and a slab of microwave-penetrable material has been attached in the place of said wall, so that when microwave power is applied at one end of said waveguide, a plasma is generated at the boundary between said slab of dielectric and the volume of said reaction vessel, said plasma having sufficient electron density to cause a reflecting action of said plasma, said reflecting action enabling the propagation of the microwaves within the waveguide and causing said plasma to be generated along the entire length of said waveguide.

2. The device of claim 1, wherein a piece of dielectric material is provided to cover said portion of said applicator which was removed, said piece of dielectric material being characterized as being penetrable by microwave energy.

3. The device of claim 1 wherein said applicator is filled with a solid dielectric.

4. The device of claim 3 wherein said solid dielectric is a member selected from the group consisting of aluminum oxide, quartz and fused silica.

5. The device of claim 2 wherein the hollow conductor is under vacuum as said controlled plasma is formed.

6. The device of claim 2 wherein said hollow conductor is substantially filled with a gas.

7. The device of claim 2 wherein said hollow conductor is filled with a liquid dielectric.

8. The device of claim 1 further comprising coupling means between said microwave power supply and hollow conductor to facilitate introduction of microwave energy from said microwave power supply to said hollow conductor.

9. The device of claim 8 wherein said coupling means comprises means for preventing dielectric material located within said hollow conductor from entering said microwave generator.

10. The device of claim 8 comprising a terminating device located within or attached to said hollow conductor and spaced from said coupling means.

11. The device of claim 1 wherein said hollow conductor is in the form of a waveguide wherein microwave energy is introduced at on end thereof and a terminating device located at another end thereof for the propagation of microwave energy throughout its length.

12. The device of claim 1 wherein said microwave power supply comprises a microwave power supply.

13. The devise of claim 1 wherein at least one permanent magnet is located proximate said hollow conductor.

14. The device of claim 13 wherein said permanent magnet is of a strength to provide a magnetic field within said reaction vessel of 874 Gauss to create electron cyclotron resonance at 2.45 Ghz.

15. The device of claim 1 further comprising a manifold for introduction of a gas to the reaction vessel adjacent to said hollow conductor.

16. The device of claim 10 wherein said terminating device is capable of absorbing microwave power which impacts thereon.

17. The device of claim 10 wherein said terminating device is capable of reflecting microwave power which impacts thereon.

18. The device of claim 10 wherein said terminating device is capable of phase shifting microwave power which impacts thereon.

19. The device of claim 1 in which said applicator comprises a set of two hollow conductors appended to said reaction vessel each having a longitudinal axis and further characterized in that the longitudinal axes are substantially parallel to one another.

20. The device of claim 19 wherein the microwave energy is introduced into said hollow conductors on opposite ends thereof such that flow of microwave power in said two hollow conductors flows in parallel but in opposite directions so that the controlled plasma measured at points equidistant from a line perpendicular to the hollow conductors and passing through their centers will be equal for the two hollow conductors.

21. The device of claim 19 wherein microwave power in each hollow conductor exists in the form of standing resonant waves having intensity peaks and troughs which are established such that intensity peaks in one hollow conductor substantially align with troughs in the second hollow conductor.

22. The device of claim 1 wherein said hollow conductor is provided in an elongated form having terminal ends and a midpoint along its longitudinal axis and a port for introduction of microwave power substantially at said midpoint.

23. The device of claim 1 wherein walls of said vessel are bevelled from said hollow conductor to facilitate propagation of plasma in said reaction vessel.

24. A device for enhancing a reaction between a reaction gas and a surface of a substrate comprising a vessel containing a substrate, a microwave generator capable of generating microwave energy, an applicator as a hollow conductor sized and positioned to receive said microwave energy and selectively direct said microwave energy into said vessel and a manifold for the introduction of a reaction gas into said vessel in near said applicator, wherein a portion of said applicator is removed forming an open region which is occupied by a material penetrable by microwaves in an area where said applicator contacts said reaction gas.

25. The device of claim 24 in which said vessel further contains an ionizable gas and wherein said microwave generator creates a plasma within said vessel, said plasma reflecting at least a portion of microwave energy emanating from said applicator back to said applicator where said portion of said applicator is occupied by said material penetrable by microwaves.

26. The device of claim 1 further comprising at least one means for adjusting standing microwaves within said hollow applicator.

27. The device of claim 26 wherein said means of adjusting standing microwaves comprises adjustable conducting stubs which enter said applicator through at least one wall thereof.

28. The device of claim 1 further comprising mode mixers for adjustably changing the configuration of the internal volume of said hollow conductor.

29. The device of claim 1 further comprising at least one means for adjusting standing microwaves within said waveguide.

30. The device of claim 29 in which said means for adjusting microwaves comprises adjustable conducting stubs which enter said waveguide through at least one wall thereof.

31. The device of claim 1 further comprising mode mixers for adjustably changing the configuration within the internal volume of said waveguide.

32. The device of claim 1 wherein the microwave power propagates in the $TE_{0,1}$ mode.

33. A device comprising a circular structure having the shape of a right circular cylinder whose height is much less than its diameter wherein the base and circular wall of said structure are comprised of metal and the volume defined by said base and wall are filled with a circular piece of dielectric so that one circular face of said dielectric is adjacent said metal base, and the top of said dielectric lies in the same plane as the top of said wall, said structure being connected in the center of said base to a source of microwave power, and said structure being mounted to a reaction vessel so that said top of said dielectric plate is adjacent the internal volume of said reaction vessel, and when microwave power is applied at the center of said base of said structure a plasma is generated at the boundary between said piece of dielectric and the volume of said reaction vessel, said plasma having sufficient electron density to bring about a reflecting action of said plasma, said reflecting action enabling the propagation of the microwaves within said cylindrical structure causing said plasma to be generated along the entire top surface of said circular structure.

34. The device of claim 33 wherein said solid dielectric is a member selected from the group consisting of aluminum oxide, quartz and fused silica.

35. The device of claim 33 wherein at least one permanent magnet is located proximate said waveguide.

36. The device of claim 33 wherein said permanent magnet is of a strength to provide a magnetic field within said reaction vessel of 874 gauss to create electron cyclotron resonance at 2.45 Ghz.

37. The device of claim 33 further comprising a manifold for the introduction of gas into the interior of said reaction vessel adjacent said waveguide.

38. The device of claim 33 further comprising at least one means for adjusting standing microwaves within said waveguide.

* * * * *

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

In the drawings:

FIG. 3, the line from element 38 to element 35 should be shown as connected to element 35;

FIG. 6A, delete "60" and insert therefore --A-- for both occurrences;

FIG. 13, delete the occurrence of "132" connected to two lead lines and insert therefore --131--.

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

Column 1, line 45, delete "stable, and" and insert therefore --stable and--;

column 3, line 13, delete "means of excitation" and insert therefore --means for exciting--;

column 3, lines 47-49, delete "applicator where is is directed into the remaining portion of the applicator so as to extend" and insert therefore --applicator. This extends--;

column 4, line 1, delete "comprise the use of a plurality of" and insert therefore --use a plurality of--;

column 4, line 3, delete "density, and" and insert therefore --density and--;

column 4, line 14, after embodiment, delete "or" and insert therefore --of--;

column 4, line 27, delete "FIG 6" and insert therefore --FIG. 6A--;

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

column 4, line 1, delete "comprise the use of a plurality of" and insert therefore --use a plurality of--;

column 4, line 30, delete "6a" and insert therefore --6B--;

column 4, line 31, delete "6" and insert therefore --6A--;

column 4, line 30, delete "6a" and insert therefore --6B--;

column 4, line 1, delete "comprise the use of a plurality of" and insert therefore --use a plurality of--;

column 4, lines 42-43, delete "through the line AA of FIG. 8" and insert therefore --through the embodiment of FIG. 8--;

column 4, line 45, delete "in plan";

column 5, line 44, delete "short, partial reflector" and insert therefore --short, a partial reflector--;

column 5, line 44, delete "or dummy load" and insert therefore --or a dummy load--;

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

column 5, line 48, delete "nearest to" and insert therefore --adjacent--;

column 7, line 28, delete "Widen" and insert therefore --when--;

column 8, line 55, delete "transmitting" and insert therefore --transiting--;

column 9, line 27, delete "over the large area." and insert therefore --over a large area.--;

column 9, line 38, delete "The larger wall" and insert therefore --A section of the wall--;

column 12, lines 33-34, delete "FIG. 6 and 6a show another embodiment of the applicaotr in which the dielectric window" and insert therefore --FIG. 6A and 6B show another embodiment of the applicator. FIG. 6A is a perspective view and FIG. 6B is a section through FIG. 6A made by the plane AA. The dielectric window--;

column 12, line 41, delete "this location" and insert therefore --the location--;

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

column 12, line 43, delete "FIG. 6" and insert therefore --FIG. 6A and FIG. 6B--;

column 13, line 49, delete "technology, They" and insert therefore --technology. They--;

column 13, lines 53 and 61, delete "8a" and insert therefore --8A-- for both occurrences;

column 14, lines 9 and 10, delete "8b" and insert therefore --8B-- for both occurrences;

column 15, line 14-15, delete "a configuration consisting of at least on permanent magnent 97" and insert therefore --a configuration 97 consisting of at least one permanent magnet--;

column 15, lines 32, delete "plan which has" and insert therefore --plan, and which has--;

column 16, line 24, delete "power shown by the arrow 68 excites" and insert therefore --power excites--;

column 5, line 44, delete "short, partial reflector" and insert therefore --short, a partial reflector--;

column 5, line 44, delete "or dummy load" and insert therefore --or a dummy load--;

UNITED STATES PATENT AND TRADEMARK OFFICE
CERTIFICATE OF CORRECTION

PATENT NO. : 5,714,009

DATED : February 3, 1998

INVENTOR(S) : Boling

It is certified that error appears in the above-identified patent and that said Letters Patent is hereby corrected as shown below:

column 16, line 53, delete "target 63" and insert therefore --target 111--;

column 16, line 57, delete "applicator 63" and insert therefore --applicator 110--;

column 16, line 58, after "enhancement", delete "in" and insert therefore --of--;

column 17, line 12, before "the surface", delete "at" and insert therefore --of--;

column 17, lines 42-48, after "surface.", delete the last two sentences of the paragraph, beginning "For example" and ending with "invention."

column 17, line 52, delete "process" and insert therefore --processes--;

Signed and Sealed this

Twenty-ninth Day of June, 1999

*Attest:*

Q. TODD DICKINSON

*Attesting Officer*     *Acting Commissioner of Patents and Trademarks*